(12) United States Patent
Jain et al.

(10) Patent No.: US 7,368,370 B2
(45) Date of Patent: May 6, 2008

(54) SITE-SPECIFIC NANOPARTICLE SELF-ASSEMBLY

(75) Inventors: Faquir C. Jain, Storrs, CT (US); Fotios Papadimitrakopoulos, Vernon, CT (US)

(73) Assignee: The University of Connecticut, Storrs, CT (US)

( * ) Notice: Subject to any disclaimer, the term of this patent is extended or adjusted under 35 U.S.C. 154(b) by 140 days.

(21) Appl. No.: 11/454,963

(22) Filed: Jun. 15, 2006

(65) Prior Publication Data

US 2008/0070354 A1 Mar. 20, 2008

Related U.S. Application Data

(60) Provisional application No. 60/691,157, filed on Jun. 15, 2005.

(51) Int. Cl.
*H01L 21/425* (2006.01)

(52) U.S. Cl. .............. 438/514; 438/197; 438/778; 438/785; 257/E21.051; 257/E21.135; 977/840

(58) Field of Classification Search ............... 438/516; 257/E21.051, E21.177, E21.4, E21.147; 977/809, 977/840, 882

See application file for complete search history.

(56) References Cited

U.S. PATENT DOCUMENTS

| | | | |
|---|---|---|---|
| 6,303,516 B1 * | 10/2001 | Morita et al. | ............. 438/758 |
| 7,208,793 B2 * | 4/2007 | Bhattacharyya | ............. 257/314 |
| 2004/0033679 A1 * | 2/2004 | Jacobson et al. | ............. 438/510 |

* cited by examiner

*Primary Examiner*—Michael Lebentritt
*Assistant Examiner*—Cheung Lee
(74) *Attorney, Agent, or Firm*—Cantor Colburn LLP

(57) ABSTRACT

Disclosed herein are methods of self-assembling nanoparticles on specific sites of a substrate. The method generally includes introducing a p-type dopant species to at least a portion of an n-type substrate or introducing an n-type dopant species to at least a portion of a p-type substrate, wherein the dopant species creates a surface charge opposite in polarity to that of the substrate surface prior to the introducing; contacting the nanoparticles with the surface of the substrate; and self-assembling a layer of the nanoparticles on p-type regions of the substrate. The methods described herein may be used in the formation of sub-22 nanometer channels, which find use in field-effect transistors, electronic chips, nanoscale biosensors, photonic band gap devices, lasers in optoelectronics and photonics chips, as well as nano-electro-mechanical devices (NEMS).

30 Claims, 13 Drawing Sheets

Three-dimensional schematic showing the site-specific deposition of $Si/SiO_x$ nanoparticles on p-Si or p-Si regions having a thin layer of $SiO_2$ or other insulator.

SITE-SPECIFIC NANOPARTICLE SELF-ASSEMBLY

CROSS REFERENCE TO RELATED APPLICATIONS

The present application relates to, and claims the benefit of, U.S. Provisional Patent Application No. 60/691,157, which was filed on Jun. 15, 2005 and is incorporated herein in its entirety.

STATEMENT REGARDING FEDERALLY SPONSORED RESEARCH

The United States Government has certain rights in this invention pursuant to National Science Foundation Grant No. CCR-0210428 and Office of Naval Research Contract No. N00014210883.

BACKGROUND

This disclosure relates generally to self-assembly of nanoparticles and, more specifically, to site-specific nanoparticle self-assembly.

Self-organization methodologies have been used in bridging top-down sub-micrometer fabrication approaches with engineering at the nanometer level. One promising self-assembly approach includes strained layer epitaxy that results in self-organized quantum dots. Another promising approach involves the deposition of nanoparticles on a variety of surfaces including metals, insulators and semiconductors, such as shown schematically in FIG. 1 for CdSe and CdSe/ZnS nanoparticles on glass. This includes the layer-by-layer assembly of CdSe and CdSe/ZnS (core/shell) nanocrystals with 1,12-diaminododecane. In one report, clean substrates were then taken into a glove box and immersed for 2 minutes in an anhydrous 0.05 molar (M) THF solution of diethylzinc, followed by a 2.5 minute wash in fresh THF to remove excess diethyl zinc. Afterwards, the substrates were immersed for 2 minutes in $10^{-3}$ M THF solution of diamine followed by a 2.5 minute wash in THF. The substrates were then taken out of the glove box and mounted on an automatic slide stainer, which was programmed to repeat a dip cycle including alternative dipping with 2-2.5 minute intervals, in a dispersion of nanocrystals (NCs) (having absorbance of 0.2 at 600 nm) in chloroform and in $10^{-3}$ M THF solution of diamine, with solvent washes in between. This technique however does not result in site-specificity.

Another example of non-site-specific assembly of semiconductor nanoparticles involves the self-assembly of $SiO_x$-coated-Si nanoparticles on a variety of substrates such as glass and metal. FIGS. 2 (a) and (b) show atomic force microscope (AFM) images of this type of thin film. FIG. 2(c) illustrates the X-ray photoelectron spectroscopy (XPS) spectrum of $Si/SiO_x$ nanoparticles deposited on a silver substrate, as compared to unoxidized, milled Si and the corresponding uncoated silver substrate. The $SiO_x$ portion appears to be about 3 to 4 nanometers (nm) thick, contributing about 52.5% of the total nanoparticle volume.

Site-specific self-assembly includes advanced recognition patterns, such as inherent in DNA-decorated nanoparticles, quantum dots, and other nano/sub-micrometer entities that attach to certain receptors on specified substrate sites. An example of site-specific self-assembly using DNA-decorated nanoparticles is schematically shown in FIG. 3. Site selectivity may also be obtained by the site-specific deposition of certain reagents that in turn permit deposition of nanoparticles onto these reagent-coated patterns. However, these techniques generally do not permit lateral size reduction of the as-deposited and/or lithographically obtained patterns.

It would be particularly advantageous if a self-assembly method permits not only the site-specific deposition of nanoparticles onto predetermined sites of a substrate but also enables reduction in the lateral size of these nanoparticle regions below the attainable limits for existing lithographic technologies.

SUMMARY

Disclosed herein are methods of self-assembling nanoparticles on specific sites of a substrate. The method generally includes introducing a p-type dopant species to at least a portion of an n-type substrate or introducing an n-type dopant species to at least a portion of a p-type substrate, wherein the dopant species creates a surface charge opposite in polarity to that of the substrate surface prior to the introducing; contacting the nanoparticles with the surface of the substrate; and self-assembling a layer of the nanoparticles on p-type regions of the substrate.

A method of forming a p-channel field effect transistor includes depositing a patterned mask layer on a surface of an n-type substrate; introducing p-type dopant species to at least a portion of the unmasked surface of the n-type substrate to form p-type regions on the surface of the n-type substrate; removing the patterned mask layer from the surface of the n-type substrate; contacting a plurality of nanoparticles with the surface of the n-type substrate; self-assembling a layer of the nanoparticles on the p-type regions of the surface of the n-type substrate; consolidating the layer of the nanoparticles into a thin film by heating the nanoparticles; depositing a gate insulator on the thin film; depositing a gate material on the gate insulator; etching the gate material and the gate insulator from a source location and from a drain location; depositing a source material in the source location and a drain material in the drain location; and depositing contacts for the source, gate, and drain.

A method of forming an n-channel field effect transistor includes depositing a patterned mask layer on a surface of a p-type substrate; introducing n-type dopant species to at least a portion of the unmasked surface of the p-type substrate to form n-type regions on the surface of the p-type substrate; removing the patterned mask layer from the surface of the p-type substrate; contacting a plurality of nanoparticles with the surface of the p-type substrate; self-assembling a layer of the nanoparticles on the p-type regions of the surface of the p-type substrate; depositing a layer of a dielectric material on the surface of the p-type substrate, wherein the nanoparticles serve as a mask for the deposition of the layer of the dielectric material; removing the nanoparticle mask from the surface of the p-type substrate; depositing a gate insulator on the surface of the p-type substrate; depositing a gate material on the gate insulator; etching the gate material and the gate insulator from a source location and from a drain location; depositing a source material in the source location and a drain material in the drain location; and depositing contacts for the source, gate, and drain.

A p-channel field effect transistor, an n-channel field effect transistor, and a complementary field effect transistor comprising both the p-channel field effect transistor and the n-channel field effect transistor are also disclosed.

The above described and other features are exemplified by the following figures and detailed description.

BRIEF DESCRIPTION OF THE DRAWINGS

Referring now to the Figures, which are exemplary embodiments, and wherein the like elements are numbered alike.

DETAILED DESCRIPTION

Disclosed herein are methods of depositing thin films of nanoscale materials onto pre-selected sites or regions of a substrate. For example, $SiO_x$-coated —Si nanoparticles (Si/$SiO_x$), positively charged $SiO_x$ nanoparticles, $SiO_x$ sol-gels, tetraethoxysilane (TEOS), or the like are deposited onto a semiconductor, insulator, and/or dielectric-on-metal substrate. Also described herein are methods of reducing the size of as-deposited thin films or patterns that have been created using the deposition technique described herein or any lithographic technique. In addition, nanometer-scale field-effect transistors (FETs) and methods for their manufacture are described.

As used herein, the terms "nanoscale" or "nanostructured" refer to materials having an average longest grain dimension of less than or equal to about 100 nanometers (nm).

Also, as used herein, the terms "first," "second," "bottom," "top," and the like do not denote any order or importance, but rather are used to distinguish one element from another; and the terms "the", "a" and "an" do not denote a limitation of quantity, but rather denote the presence of at least one of the referenced item. Furthermore, all ranges reciting the same quantity or physical property are inclusive of the recited endpoints and independently combinable. The modifier "about" used in connection with a quantity is inclusive of the stated value and has the meaning dictated by the context or includes at least the degree of error associated with measurement of the particular quantity.

Figure 5:
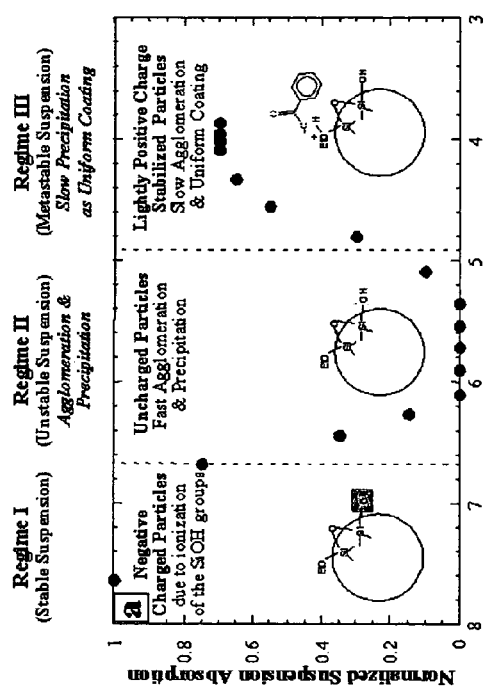
FIG. 5(a) schematically illustrates the effect of pH on suspension stability for silicon nanoparticles.
FIG. 5(b) schematically illustrates the interaction of positively charged $SiO_x$-coated-Si nanoparticles (Si/$SiO_x$) on n-type and p-type substrates.
Figure 5:
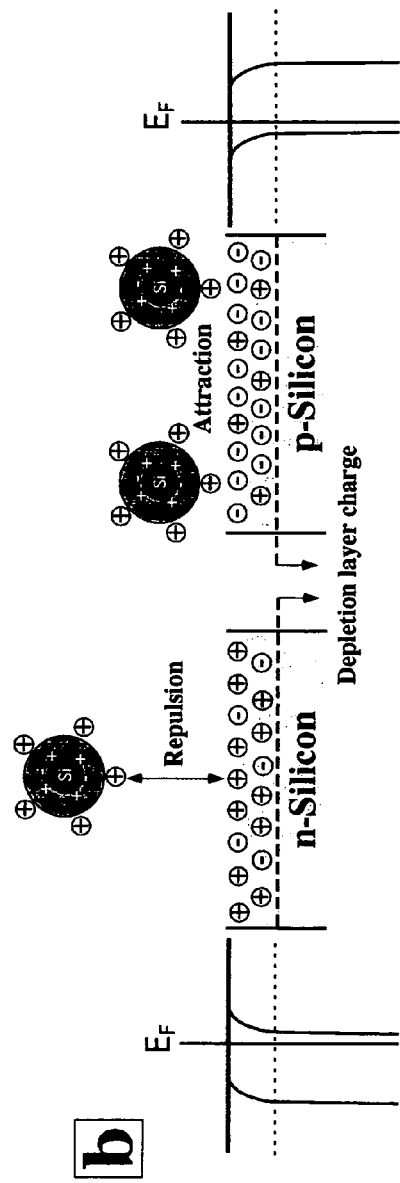

In an exemplary embodiment, $SiO_x$-coated Si particles are self-assembled only onto p-doped regions and not on n-doped regions of a silicon substrate. The charge density (ρ) per unit volume owing to doping of the silicon substrate may be negative (i.e., $-qN_A$, wherein q is the magnitude of electron charge and $N_A$ is the concentration of acceptor dopants) or positive (i.e., $+qN_D$, wherein ND is the concentration of donor dopants). The surface depletion layer on p-type silicon generally hosts negative space charge density (per unit area $Q_{SC}=qN_AW$, wherein W is the depletion layer width). The site-selectivity arises from the fact that deposition of Si/$SiO_x$ nanoparticles, which are charged positively owing to the low ethanolic pH that they are dispersed within (see e.g., FIG. 5), takes place only on Si surfaces having p-doping or negative surface space-charge density. In heavily doped p+ surfaces, the deposition also may not take place due to rapid precipitation of the positively charged Si/$SiO_x$ nanoparticles.

Figure 1:
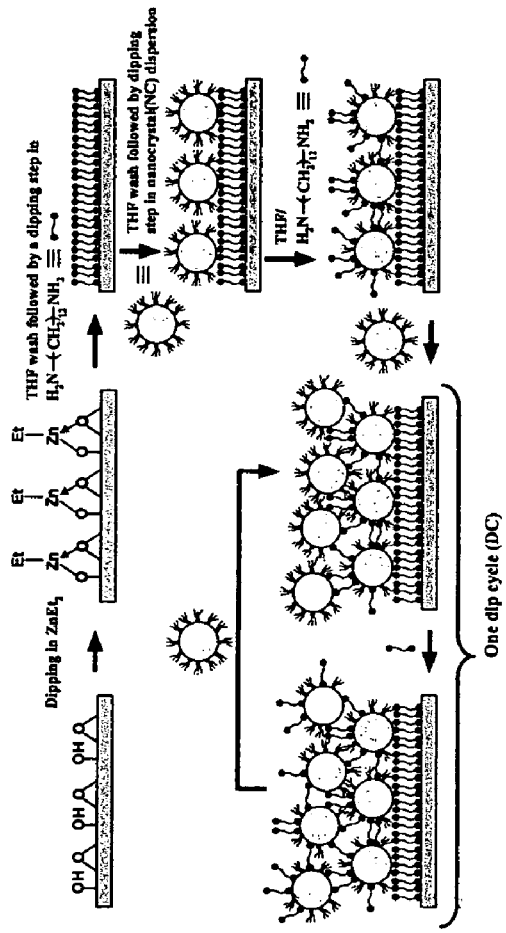
FIG. 1 is a schematic illustration of a prior art process for non-site-specific layer-by-layer self-assembly of CdSe nanoparticles on a substrate.
Figure 2:
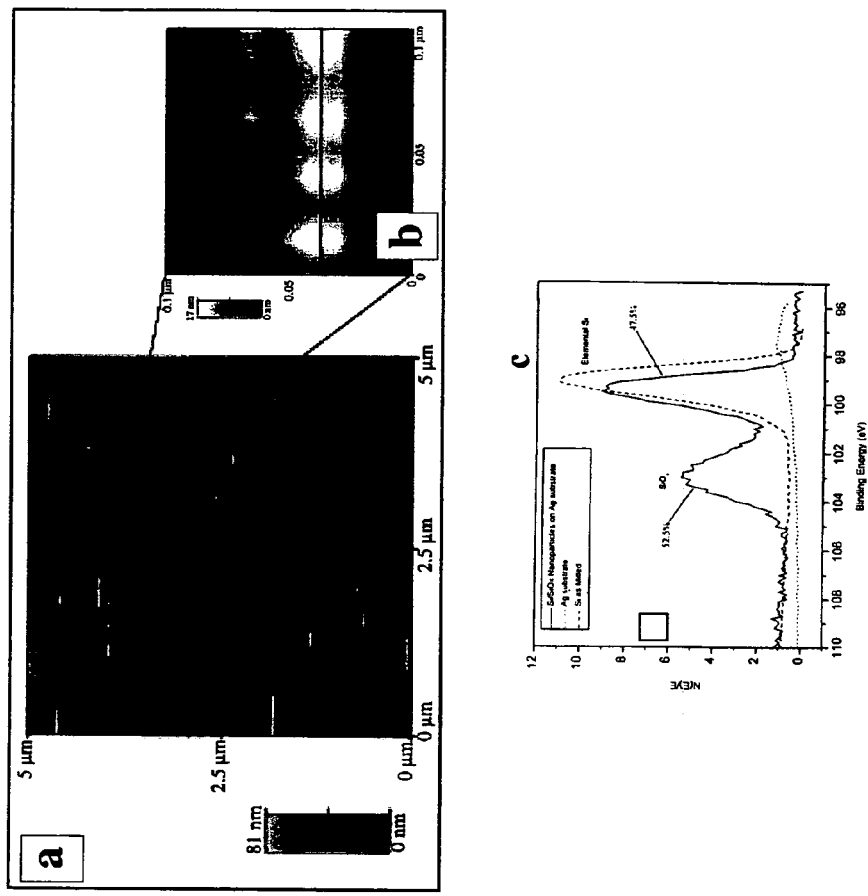
FIG. 2(a) is an atomic force microscope (AFM) image of $SiO_x$-coated Si nanoparticles (Si/$SiO_x$) deposited on a substrate.
FIG. 2(b) is an enlarged inset of the AFM image of FIG. 2(a)
FIG. 2(c) illustrates an X-ray photoelectron spectroscopy (XPS) spectrum of a Si/$SiO_x$ nanocomposite deposited on silver.
Figure 3:
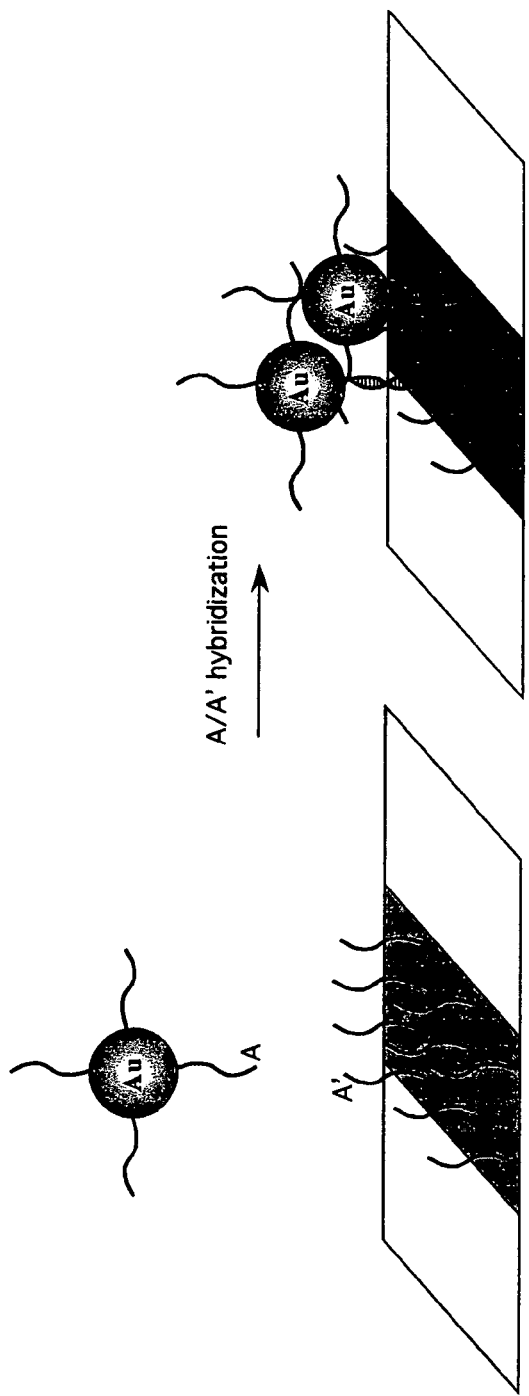
FIG. 3 is a schematic illustration of a process for site-specific self-assembly of DNA-decorated gold nanoparticles onto substrates decorated with complementary DNA-strands.
Figure 4A:
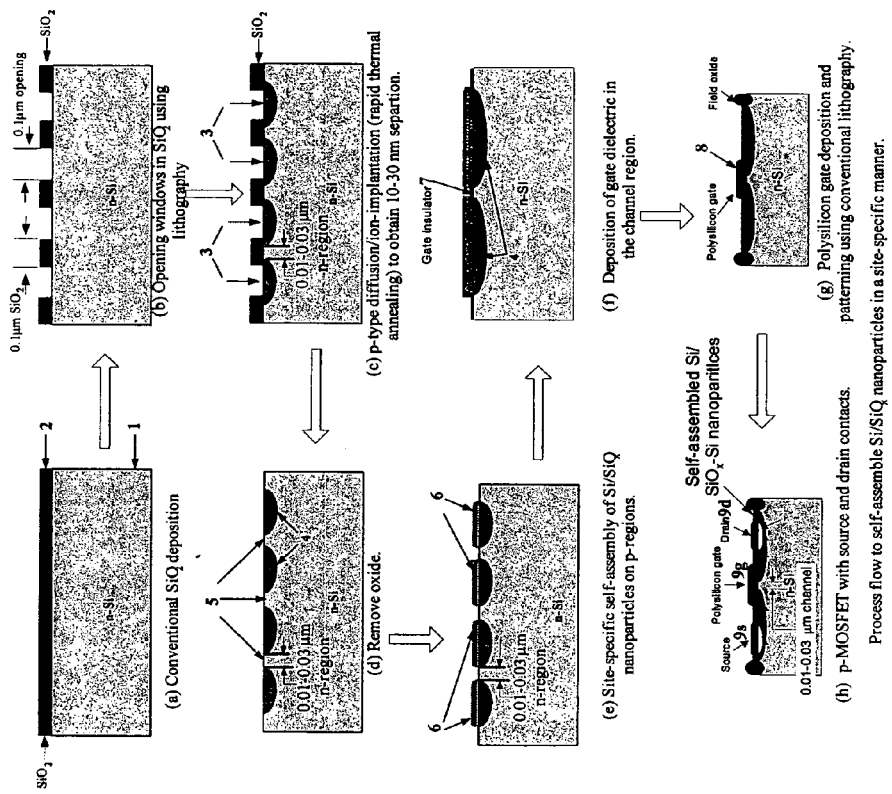
FIG. 4A is a schematic illustration of a process for site-specific self-assembly of nanoparticles on an n-type substrate as well as fabrication of a p-channel field-effect transistor.
Figure 4B:
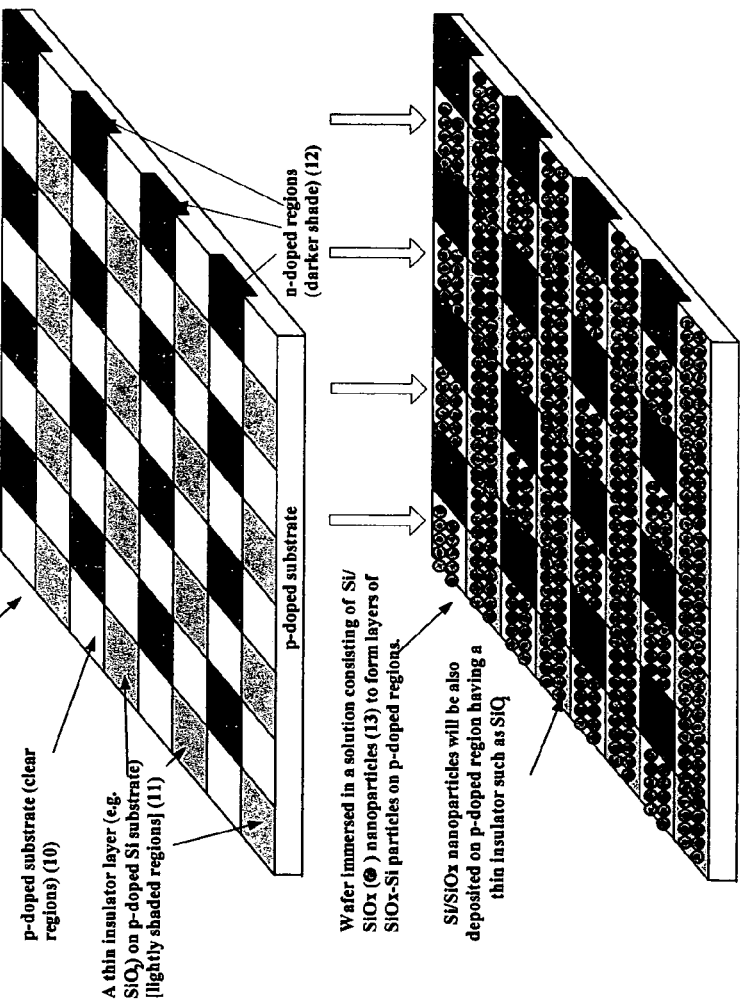
FIG. 4B is a three dimensional schematic illustration of a substrate containing regions of p-doped Si, $SiO_2$ coated p-doped Si, and n-doped Si before and after site-specific self-assembly of nanoparticles on the substrate.
Figure 4C:
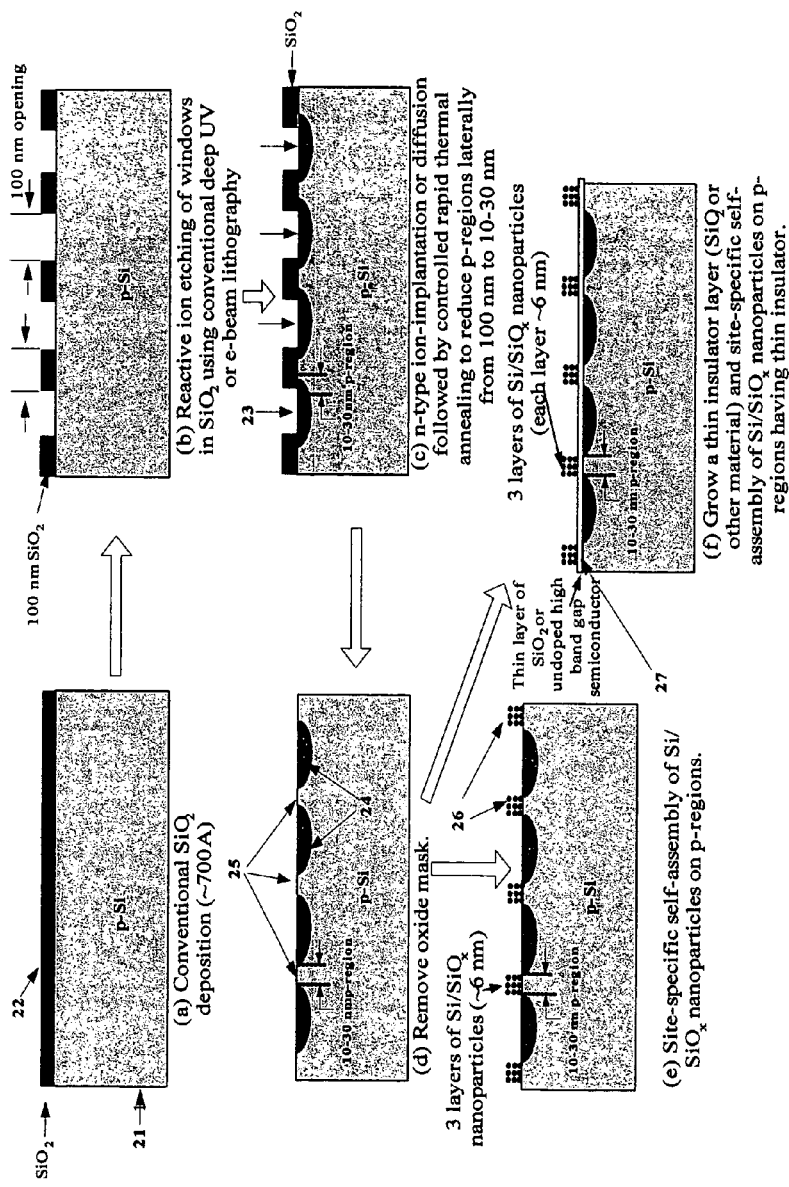
FIG. 4C is a schematic illustration of a process for site-specific self-assembly of nanoparticles on a p-type substrate.

Embodiments of the processing cycle involving site-specific self-assembly of Si/$SiO_x$ nanoparticles as well as steps for the fabrication of field-effect transistors (FETs) are shown for example in FIGS. 4A and 4C. A difference between FIG. 4A and FIG. 4C is the doping type of the substrate itself. Specifically, the substrate is n-doped in FIG. 4A, whereas it is p-doped in FIG. 4C. Combining either of these two processes using conventional CMOS (complementary metal oxide semiconductor) methodology will result in the fabrication of sub-22 nm gate CMOS devices and circuits.

For convenience, reference will now be made to FIG. 4A. A mask layer 2 is first deposited onto the n-doped silicon substrate 1, as shown in FIG. 4A(a). Although the mask layer 2 is shown as $SiO_2$, it should be recognized that other compositions can be used including $Si_3N_4$, or another semiconducting material that can be selectively patterned and etched such as Si, Ge, GaAs, ZnS, CdSe, ZnSe, ZnSSe, InGaAs, GaN, InP, or combinations comprising at least one of the foregoing. Using any of a variety of lithographic masking techniques, the mask layer 2 is patterned to create openings exposing the underlying Si surface of the substrate 1. In the case of a silicon on oxide (SOI) substrate, the Si substrate 1 is left exposed, as in FIG. 4A(b).

Masking the substrate 1 is followed by an ion implantation or diffusion of p-type species 3, such as boron or gallium, as shown in FIG. 4A(c). The regions where there is no $SiO_2$ mask layer 2 become implanted with p-dopant species to provide regions 4 in the substrate with an opposite doping to that of the overall or bulk substrate 1. In the case of ion implantation, the implantation of dopant (with a specific dose density (ion/cm$^2$) and energy which determine the concentration and depth profile) is followed by a process known as rapid thermal annealing (RTA), which removes any damage to the lattice and restores the lattice, while activating the dopant. The RTA also expands the p-type regions 4 causing a narrowing of the remaining n-type regions 5 underneath the $SiO_2$ mask layer 2. Other processes for expanding the p-type regions include electron beam annealing, plasma hot gas annealing, laser annealing, or a combination comprising at least one of the foregoing. Once these p-type regions 4 have been created, the $SiO_2$ mask layer 2 is removed, as shown in FIG. 4A(d). Subsequently, the substrate is immersed in an ethanolic suspension containing $SiO_x$ coated Si nanoparticles, which are shown as dots in FIG. 4A(e), and results in the deposition of a Si/$SiO_x$ nanoparticle film 6 on top of the p-type regions. The thin film 6 comprises many layers of $SiO_x$ coated Si nanoparticles. The number of layers depends on the deposition process including pH and the immersion time. If desired, this site-specific self-assembled thin film of Si/$SiO_x$ nanoparticles 6 can be further consolidated using a heat treatment step either in an inert or oxidizing environment to yield an insulating layer.

FIG. 4B is a three-dimension schematic illustration of a substrate that contains regions of p-doped Si 10, $SiO_2$ coated p-doped Si 11, and n-doped Si 12 before and after site-specific self-assembly of nanoparticles on the substrate. These regions may be created, for example, by selectively doping a p-type Si substrate using known doping techniques. Alternatively, an epitaxial substrate can be patterned to have these regions. The Si/$SiO_x$ nanoparticles 13 will selectively deposit onto p-doped regions 10 and 11 leaving the n-doped regions 12 uncoated. If the thin $SiO_2$ coating layer were placed on top of an n-doped Si region 12, the Si/$SiO_x$ nanoparticles will not deposit.

FIG. 4C(a-f) illustrates the creation of nanopatterns using site-specific self-assembly technique on a p-Si substrate 21. This figure is complementary to FIG. 4A, which uses an n-type Si substrate. In this embodiment, the Si/$SiO_x$ nanoparticles 26 are selectively deposited onto the laterally size reduced p-regions 25. A mask layer 22 of $SiO_2$ or another material such as $Si_3N_4$ is first deposited onto the p-doped silicon substrate 21, as shown in FIG. 4C(a). Using any of a variety of lithographic masking techniques (e.g., deep UV or electron beam lithography), the mask layer 22 is patterned to create openings exposing the underlying Si surface of the substrate 21. This is followed by an ion implantation or diffusion of n-type species 23, as shown in FIG. 4C(c). The regions where there is no $SiO_2$ mask layer 22 become implanted with the n-dopant species to provide regions 24 in the substrate with an opposite doping to that of the overall or bulk substrate 21. Once again, in the case of ion implantation, the implantation is followed by RTA, which removes any damage to the lattice and restores the lattice, while activating the dopant. In this case the RTA expands the n-regions 24 causing a narrowing of the remaining p-regions 25 underneath the $SiO_2$ mask layer 22. Once these p-type regions 25 have been narrowed, the $SiO_2$ mask layer 22 is removed, as shown in FIG. 4C(d). Subsequently, the substrate 21 is immersed in an ethanolic suspension containing $SiO_x$ coated Si nanoparticles, which are also shown as dots in FIG. 4C(e), and results in the deposition of a Si/$SiO_x$ nanoparticle film 26 on top of the p-type regions. The thin film 26 comprises many layers of $SiO_x$ coated Si nanoparticles. The number of layers depends on the deposition process including pH and the immersion time. For example, in FIG. 4C(e), there are shown 3 layers of $SiO_x$ coated Si nanoparticles having a total thickness of about 6 nm.

Alternatively, a thin layer of $SiO_2$ or other insulator or wide energy gap semiconductor 27 can be uniformly grown on top of the substrate 21 to cover both the p-type region 25 and n-regions 24. As described above, in reference to FIG. 4B, the site-specific assembly of Si/$SiO_x$ nanoparticles will also take place on top of this thin layer 27 in regions where there is p-doping underneath.

In one embodiment, the deposited $SiO_x$/Si film 6 or 26 can serve as an effective $SiO_x$ mask for subsequent processing, such as deposition of other compositions. For example, this is illustrated in FIG. 4A(f) through 4A(h) where a p-channel FET is illustrated.

For a given mask pattern, the size and/or shape of the $SiO_x$-Si thin film can be varied using a rapid thermal annealing (RTA) cycle, which controls the lateral diffusion of the introduced n- or p-type dopants. In one embodiment, the size and/or shape of the thin film is reduced by greater than or equal to about 75%, such as when an array of 60 nm×60 nm squares or any other pattern formed using lithography in conjunction with etching, is reduced to 30 nm×30 nm dimensions. In one illustration, shallow, ultra-low energy ion implants of about 30 to about 50 nm undergo the RTA cycle to laterally diffuse the dopants and create smaller p-doped regions, resulting in smaller features than can be produced using known lithographic techniques. This generic approach is compatible not only with the site-specific self-assembly techniques described herein, but with all existing lithographic techniques.

The ion implantation to create the p- or n-type regions can be controlled by adjusting the dopant concentration or the resistivity of the substrate itself. It has been found that deposition of Si/$SiO_x$ nanoparticles on p-type surfaces takes place in a narrow pH range (e.g., from about 5.7 to about 4.4), as shown in FIG. 5(a). The influence of surface charge polarity as a function of conductivity type is illustrated in FIG. 5(b). Without being bound by theory, the nanoparticles are believed to be charged owing to the protonation of the Si—OEt groups (at low pH), as well as owing to various effects including the charge $Q_{it}$ owing to the mismatch at the $SiO_x$/Si interface, presence of traps $Q_{ot}$, mobile charge $Q_m$, and the fixed oxide $Q_f$. The depletion at the Si surface causes attraction or repulsion depending on the dopant type (or Seebeck coefficient) of the substrate. For example, positively charged $SiO_x$/Si nanoparticles self-assemble on p-type surfaces, which have a negatively charged depletion layer caused by ionized acceptor atoms.

It has also been found that even if there is a thin insulator or undoped/lightly doped semiconductor layer separating the p-type region from the nanoparticles, the self-assembly still takes place. This is shown in FIG. 4B and described above. For example, a coating of thermally grown $SiO_2$, with a thickness of about 10 to about 150 Ångstoms, on p-type Si does not prevent the self-assembly of $SiO_x$/Si nanoparticles on the substrate. Other insulators that can be used to form such a layer include $HfO_2$, $HfAlO_2$, PZT, $ZrO_2$, $BaSrTiO_3$, $BaTiO_3$, ZnO, ZnMgO, $Al_2O_3$, or a combination comprising at least one of the foregoing insulators. Semiconducting materials that can be used to form such a layer include ZnS, GaAs, AlGaN, ZnBeS, ZnBeSSe, ZnBeSe, AlGaInP, or a combination comprising at least one of the foregoing semiconductors.

Figure 6:
FIG. 6 is an optical microscope image of 0.6 micrometer-wide lines of a Si/$SiO_x$ nanocomposite deposited on p-type regions of a substrate after a 50% lateral reduction in their original width of the regions.

FIG. 6 illustrates a pattern of $Si/SiO_x$ nanocomposite lines, each having a width of about 0.6 micrometers (μm), deposited on p-doped Si regions. The original dimensions were about 1.2 μm both for the lines as well as the spacing between them. Using the process described above and shown in FIG. 4C, $SiO_2$ was first thermally grown on p-type Si, and was subsequently patterned to produce the above mentioned 1.2 μm $SiO_2$ lines using an interdigitated mask. This was followed by n-type diffusion of phosphorus and heat treatment to laterally narrow the p-type regions under the patterned $SiO_2$ layer. Upon removal of the remaining $SiO_2$ patterns, the substrate with n- and p-doped regions (lines) was immersed in an ethanolic solution of $Si/SiO_x$ nanoparticles of about 20 nm. This permitted the site-specific deposition of $Si/SiO_x$ nanoparticles on only the p-doped regions, yielding 0.6 μm wide lines owing to the above-mentioned lateral reduction of the p-type regions. Upon heat treatment, the $SiO_x$/Si assembly provided a semi-insulating thin film.

Figure 7:
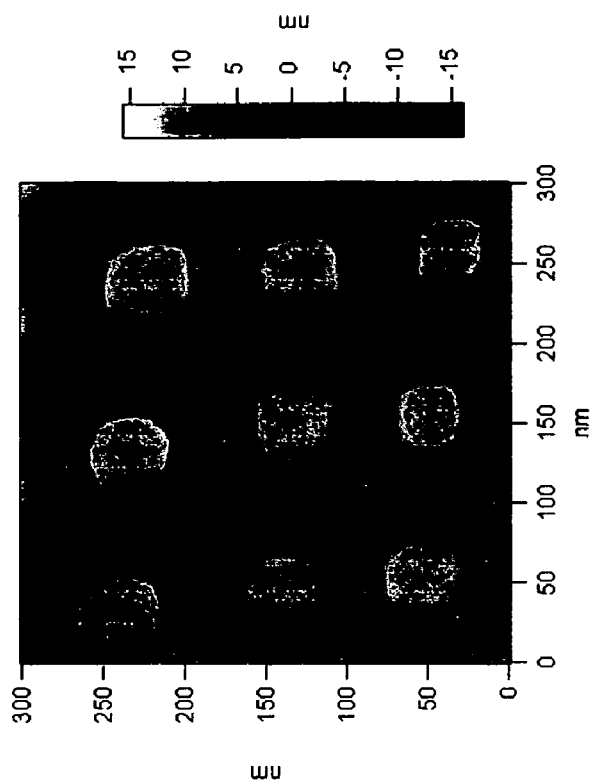
FIG. 7 is an AFM image showing the formation of island arrays of about 30 to about 35 nanometers (nm) using site-specific self-assembly of Si/$SiO_x$ nanoparticles on an electron-beam patterned p-type Si substrate.

In one embodiment, as illustrated in FIG. 7, about 30 to about 35 nm island arrays were fabricated using site-specific self-assembly of $Si/SiO_x$ nanoparticles of about 6 nm. The square boxes in the bottom row shows the position of the original 50 nm $SiO_2$ islands that were patterned onto the p-type Si substrate using e-beam lithography on about 700 Ångstrom thick $SiO_2$ which was thermally grown on a p-type Si substrate. Subsequently, an ultra low energy n-type phosphorus implantation step was performed, followed by RTA to transform exposed p-type regions of Si to n-type regions. This also resulted in narrowing of the p-type regions to less than the original size (50 nm). After etching the $SiO_2$ islands, the self-assembly of about 6 to about 8 nm $Si/SiO_x$ nanoparticles commenced on top of the narrowed (about 30 to about 35 nm) p-doped regions, which are shown in white inside the 50 nm boxes.

In another embodiment, the laterally narrowed islands were further reduced by additional thermal treatments.

Figure 8B:
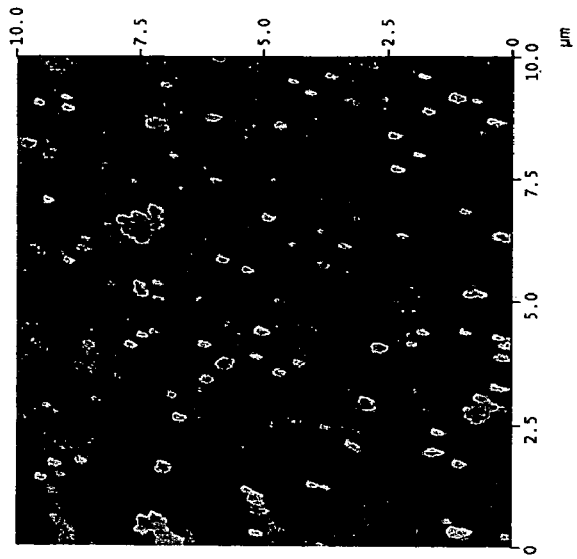
FIG. 8(b) is an AFM image of Si/$SiO_x$ nanoparticles self-assembled on p-type InGaAs surrounded by regions of n-type InP where no assembly has taken place.
Figure 8A:
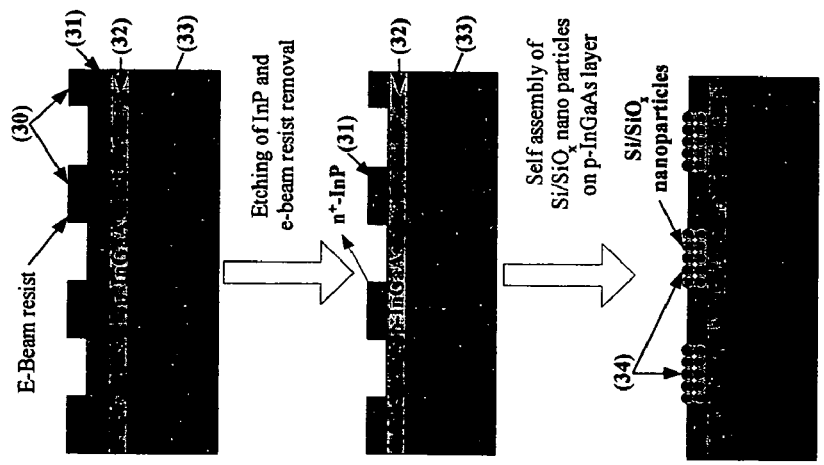
FIG. 8(a) is a schematic illustration of a process for site-specific self-assembly of nanoparticles on a substrate with p-type InGaAs regions surrounded by n-type InP epitaxial regions.

The site specific self-assembly of $Si/SiO_x$ nanoparticles on p-doped regions is a generic technique, which can be performed on substrates other than Si. This has been demonstrated for semiconductors comprising GaAs, InGaAs, and ZnSeTe as well as thin insulating films disposed on semiconductors. For example, the deposition of $Si/SiO_x$ nanoparticles on a mosaic of p-type InGaAs and n-type InP is concentrated only on the p-type InGaAs domains. This is shown in FIGS. 8A and 8B. Specifically, FIG. 8A schematically illustrates the process of patterning epitaxial InP 31—InGaAs 32—InP 33 samples using a lithographic technique. This enables patterning of an n-type InP layer 31 while exposing selected regions of p-type InGaAs 32. Subsequent immersion in an ethanolic solution of $Si/SiO_x$ nanoparticles 34 results in deposition only on the exposed p-type InGaAs regions. FIG. 8(b) is an AFM image of $Si/SiO_x$ particles (in light gray) self-assembled on p-type InGaAs. The dark regions are n-type InP where no assembly has taken place.

Figure 8D:
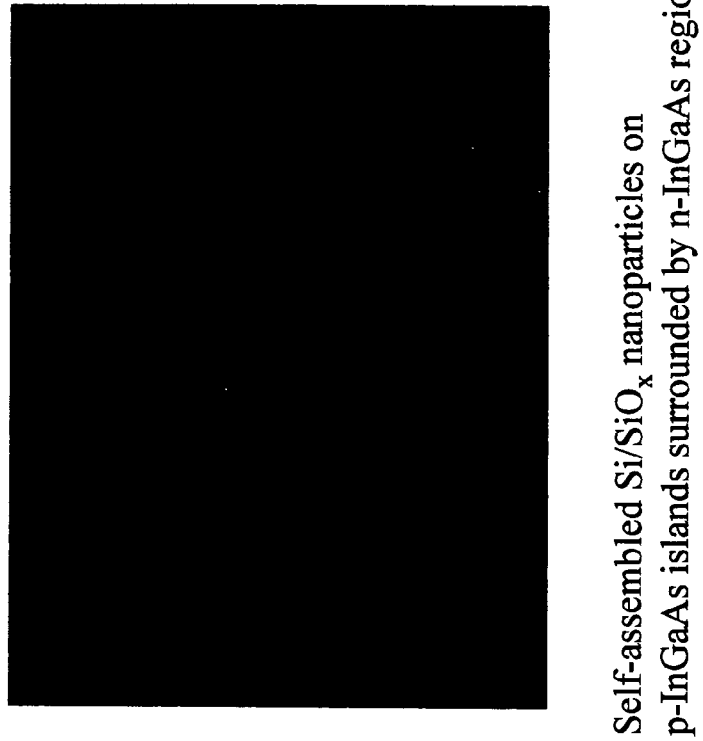
FIG. 8(d) is an optical microscope image of Si/$SiO_x$ nanoparticles self-assembled onto p-type InGaAs regions, surrounded by n-type regions of InGaAs.
Figure 8C:
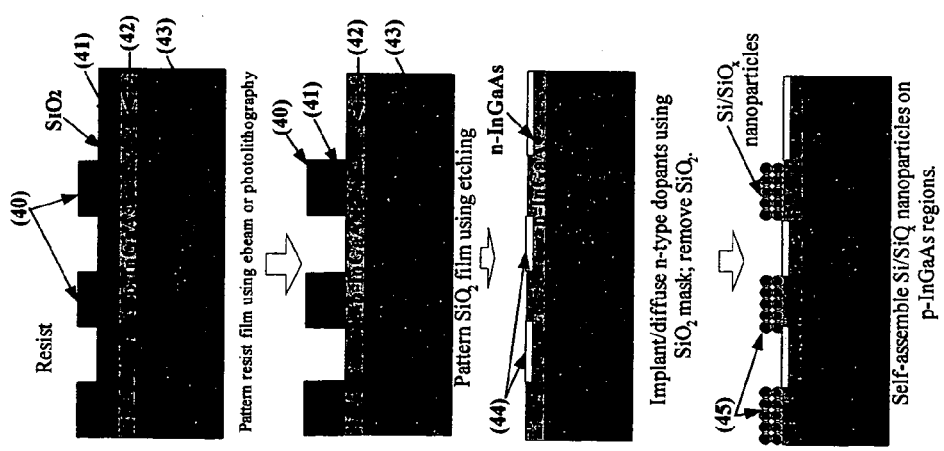
FIG. 8(c) is a schematic illustration of a process for site-specific self-assembly of Si/$SiO_x$ nanoparticles on p-type regions of InGaAs, surrounded by n-type regions of InGaAs.

FIG. 8(c) schematically illustrates a process of site-specific deposition of $Si/SiO_x$ 45 on a p-type InGaAs layer 42 having n-type regions 44 surrounded by p-type regions 42. Here, a $SiO_2$ layer 41 is grown on a p-type InGaAs layer 42, which is epitaxially grown on the InP substrate 43. With the help of a mask 40, the $SiO_2$ layer 41 is patterned exposing specific p-type InGaAs regions 42. n-type impurity dopants are implanted or diffused to create the n-type InGaAs regions 44. Upon the removal of the $SiO_2$ mask layer 40, followed by immersion in the ethanolic solution of $Si/SiO_x$, the deposition of $Si/SiO_x$ nanoparticles 45 takes place on the p-doped regions 45. FIG. 8(d) is an optical microscope image of the $Si/SiO_x$ nanoparticles 45 self-assembled onto p-type InGaAs regions 42, surrounded by n-type InGaAs squares of about 5 micrometers squared.

Figure 9:
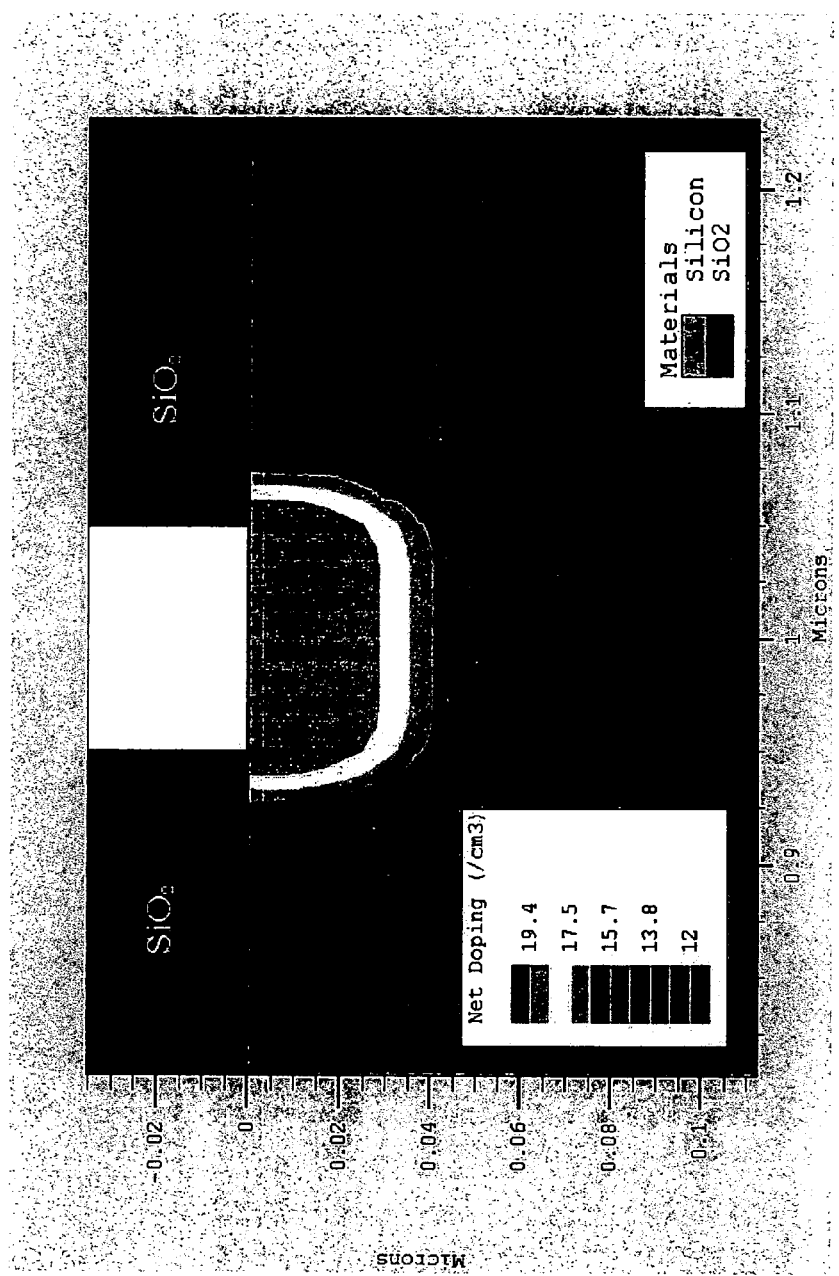
FIG. 9 shows a simulation of lateral diffusion of dopant impurities in Si underneath a $SiO_2$ mask layer.

Simulation, shown in FIG. 9, predicts the decreasing of feature size (of one type of dopant) using low energy implantation followed by rapid thermal annealing or other techniques. Here, the parameters of rapid thermal annealing can be important.

The site-specific self-assembly methods can be relevant to the formation of sub-22 nm channels as a process step in the fabrication of field-effect transistors (FETs) used in electronic chips, ultra-fine nanoscale features in biosensors, photonic band gap devices, and quantum wire and quantum dot lasers in optoelectronic and photonics chips, as well as nano-electro-mechanical (NEMs) devices for various applications.

Figure 10:
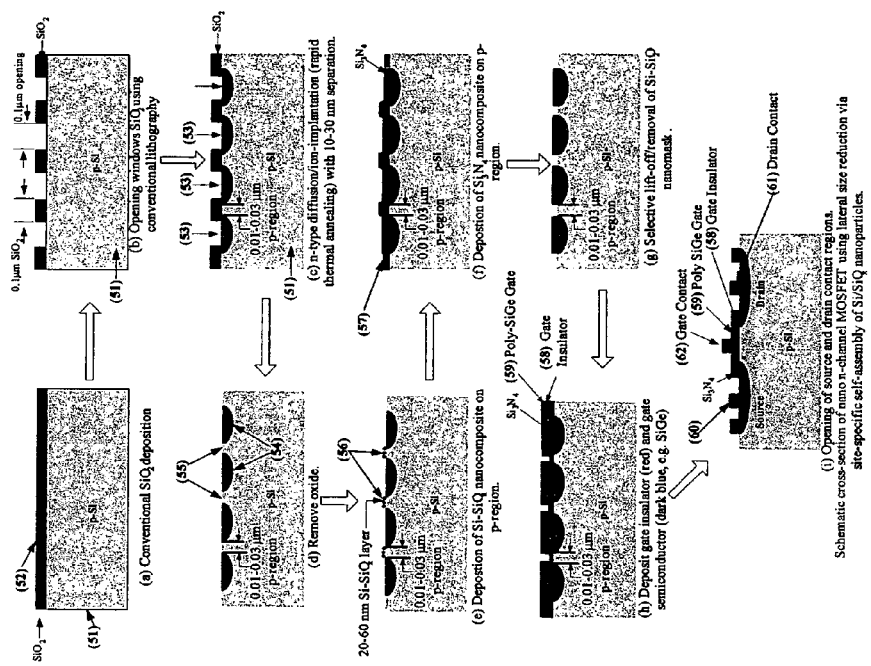
FIG. 10 is a schematic illustration of a process for site-specific self-assembly of nanoparticles on an n-type substrate as well as fabrication of a sub-20 nm n-channel field-effect transistor on a p-type Si substrate.

A methodology to fabricate FETs is shown in FIG. 4A(f) through 4A(h) and in FIG. 10, for p- and n-type channels, respectively. For the p-channel FET (FIG. 4A) after defining the narrowed n-type region, a gate insulator 7 is grown, as seen in FIG. 4A(f). Subsequently, as seen in FIG. 4A(g), a poly-Si, SiGe, or metal gate 8 is deposited using, for example, an existing lithographic technique. This is followed by opening of the source and drain regions within the $Si/SiO_x$ layer deposited on the p-type regions 4. Contacts for source 9s, gate 9g, and drain 9d are deposited in a conventional manner, and are shown in FIG. 4A(h).

Similarly, FIG. 10 illustrates the fabrication of n-channel FETs on p-type Si substrates (or p-type Si on oxide substrates). Following the patterning of a $SiO_2$ layer 52, the exposed p-type Si regions are implanted with n-type dopant impurities 53. The implanted Si substrate 51 is heat treated to remove any damage caused by implantation. This also leads to the lateral diffusion of the n-type dopants underneath the $SiO_2$ mask 52 forming smaller p-type regions 55 and larger n-type regions 54. Subsequent immersion in an ethanolic solution of $Si/SiO_x$ nanoparticles results in their deposition onto the p-type regions. This is followed by the deposition of a thin dielectric (e.g., $Si_3N_4$) layer 57, which is shown in FIG. 10(f). Removal of the $Si/SiO_x$ nanoparticles by dissolution leaves nanoscale p-type regions. This is followed by deposition of a gate insulator material 58 and gate material 59 (such as poly-Si, poly-SiGe, or a gate metal) as shown in FIG. 10(h). Subsequently the source and drain regions within the $Si_3N_4$ layer 57 deposited on n-regions 54 are opened. A source contact 60, gate contact 62, and drain contact 61 are deposited, as seen in FIG. 10A(i). Advantageously, this methodology for producing a FET provides a narrower channel than obtained using known lithographic masking techniques.

The suspension of $Si/SiO_x$ nanoparticles is largely dependent on the suspension pH, as evidenced in FIG. 5(a). This is due to the protonation of their Si—OEt surface groups, which provide enhanced interactions with the surrounding polar media (e.g., methanol, ethanol, or the like) along with inter-particle repulsion (FIG. 11a). The presence of a trace amount of water activates the acid hydrolysis of Si—OEt groups to silanol groups (Si—OH), which then slowly condense into a $SiO_x$ matrix that surrounds the nanoparticles and aids deposition cohesiveness. The speed of this deposition is dependent on the amount of water and acidity of the media. Control of both of these parameters, along with the presence of a small amount of TEOS [$Si(OEt)_4$] were found to facilitate obtaining a homogeneous deposition devoid of inter-particle voids (FIGS. 11b and 11c).

Figure 11:
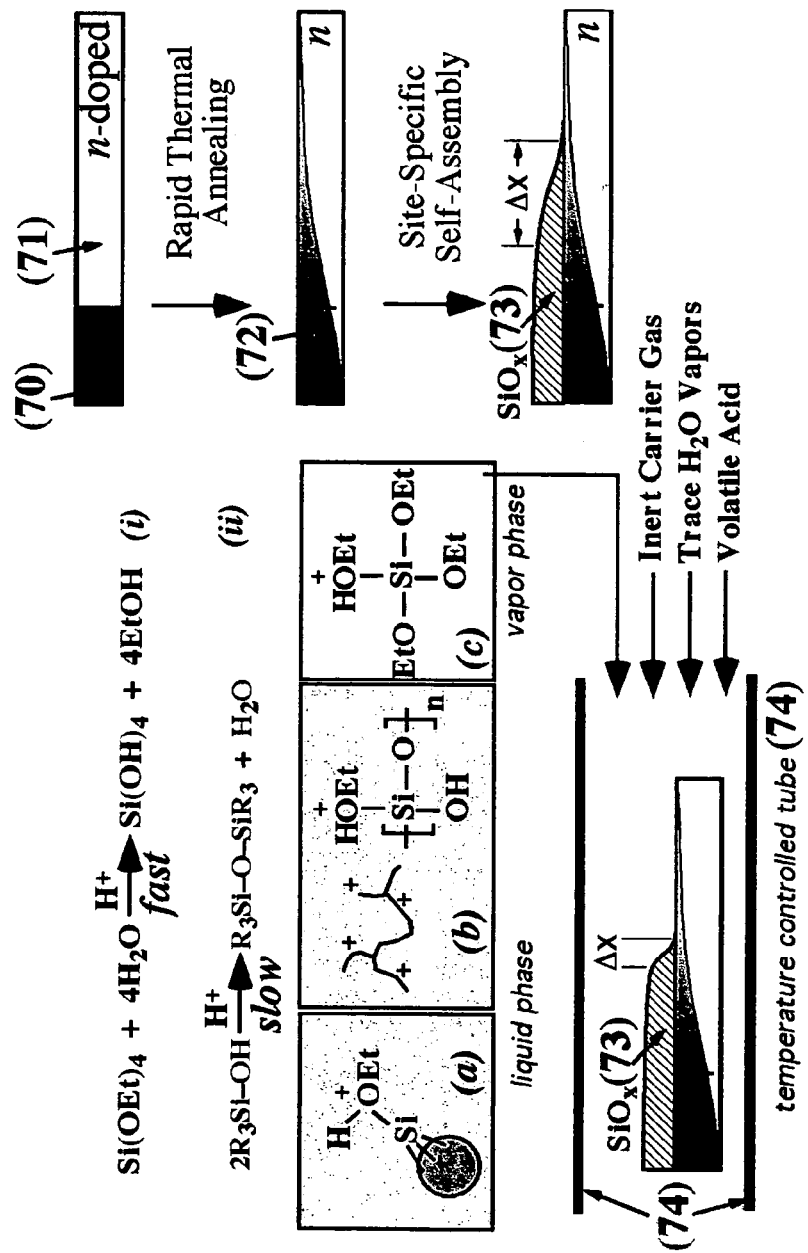
FIG. 11 schematically illustrates the acid-assisted hydrolysis of tetraethoxysilane (TEOS), along with the site-specific self-assembly of positively charged (a) $SiO_x$ nanoparticles, (b) $SiO_x$ sol-gel polymers, and (c) protonated TEOS onto p-doped regions of a semiconductor.

In the case of site-specific self-assembly, the apparent negative surface charge ($\delta^-$) that develops on the p-doped surface layer (FIG. 5b) electrostatically attracts the positively charged $Si/SiO_x$ nanoparticles and affords their selective deposition onto the p-doped regions. As shown in FIG. 11, rapid thermal annealing assists in controlled dopant diffusion to yield a gradient surface charge density 72. The site-specific deposition onto such gradient is expected to also produce a transitional edge 73 with a width of $\Delta x$. Shrinking this transitional edge bares a number of similarities with polymer photoresists.

Borrowing similar concepts from the way photoresists (which use each photon to create an individual chemical event) evolved into chemically amplified (CAM) photoresists (which use a photon to create a "catalyst" that then catalyzes multiple chemical events), it is also possible for CAM site-specific deposition methodologies to be used for patterning. Based on this, the site-specific methodology can be extended with positively charged siloxane sol-gels or positively charged TEOS vapors (FIGS. 11b and 11c, respectively). In particular, a completely solvent free site-specific deposition process is feasible based on the controlled injection of TEOS vapors, water, and traces of acids through a temperature-controlled oven 74. Once again, the $SiO_x$ 73 deposits onto the p-doped region. Similarly, this technique can be extended to dielectric coated metal surfaces. A relatively high work function metal, such as gold, platinum, and the like, can simulate conditions similar to a p-doped semiconductor while a lower work function metal, such as calcium, magnesium, and the like, can simulate conditions similar to an n-doped semiconductor. The thickness of the metal should be thin enough to prevent charge conduction from one type of region to the other. Moreover, a thin pinhole free dielectric layer, overcoating these metals, can be applied to prevent surface oxidation.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for site-specific self-assembly of nanoparticles on a surface of a substrate, the method comprising:
   introducing p-type dopant species to at least a portion of an n-type substrate or introducing n-type dopant species to at least a portion of a p-type substrate, wherein the dopant species creates a surface charge opposite in polarity to that of the substrate surface prior to the introducing;
   contacting the nanoparticles with the surface of the substrate; and
   self-assembling a layer of the nanoparticles on p-type regions of the substrate.

2. The method of claim 1, further comprising redistributing the dopant species to modify the size and/or shape of a doped region on the substrate.

3. The method of claim 2, wherein the redistributing of dopant species comprises rapid thermal annealing, ion implantation, ion implantation and rapid thermal annealing, electron beam annealing, plasma hot gas annealing, laser annealing, or a combination comprising at least one of the foregoing.

4. The method of claim 1, further comprising depositing a mask layer on the surface of the substrate prior to introducing the dopant species.

5. The method of claim 4, wherein the mask layer comprises a thermally grown oxide, silicon nitride, a semiconductor that can be selectively etched and patterned, or a combination comprising at least one of the foregoing.

6. The method of claim 5, wherein the semiconductor that can be selectively etched and patterned comprises Si, Ge, GaAs, ZnS, CdSe, ZnSe, ZnSSe, InGaAs, GaN, InP, or a combination comprising at least one of the foregoing.

7. The method of claim 4, further comprising removing at least a portion of the mask layer prior to introducing the dopant species.

8. The method of claim 4, further comprising removing the mask layer in its entirety prior to contacting the nanoparticles with the surface of the substrate.

9. The method of claim 1, further comprising depositing a layer of an insulating material or a semiconducting material on a p-type region of the substrate prior to contacting the nanoparticles with the surface of the substrate, wherein the layer of the nanoparticles self-assembles on the layer of the insulating material or the semiconducting material.

10. The method of claim 9, wherein the layer of the insulating material or the semiconducting material has a thickness of about 1 nanometer to about 15 nanometers.

11. The method of claim 9, wherein the insulating material comprises $SiO_2$, $HfO_2$, $HfAlO_2$, PZT, $ZrO_2$, $BaSrTiO_3$, $BaTiO_3$, ZnO, ZnMgO, $Al_2O_3$, or a combination comprising at least one of the foregoing insulators.

12. The method of claim 9, wherein the semiconducting material comprises ZnS, GaAs, AlGaN, ZnBeS, ZnBeSSe, ZnBeSe, AlGaInP, or a combination comprising at least one of the foregoing semiconductors.

13. The method of claim 1, wherein the nanoparticles comprise a silicon oxide-coated-silicon, silicon oxide, silane, tetraethoxysilane, or a combination comprising at least one of the foregoing.

14. The method of claim 1, wherein the surface of the substrate comprises a metal, a semiconductor, an insulator, a dielectric, or a combination comprising at least one of the foregoing.

15. The method of claim 1, further comprising consolidating the self-assembled layer of nanoparticles into a thin film by heating the nanoparticles.

16. The method of claim 1, further comprising using the self-assembled layer of nanoparticles to form a field effect transistor.

17. The method of claim 16, further wherein the field effect transistor is a sub-22 nanometer gate field effect transistor.

18. A method of forming a p-channel field effect transistor, comprising:
depositing a patterned mask layer on a surface of an n-type substrate;
introducing p-type dopant species to at least a portion of the unmasked surface of the n-type substrate to form p-type regions on the surface of the n-type substrate;
removing the patterned mask layer from the surface of the n-type substrate;
contacting a plurality of nanoparticles with the surface of the n-type substrate;
self-assembling a layer of the nanoparticles on the p-type regions of the surface of the n-type substrate;
consolidating the layer of the nanoparticles into a thin film by heating the nanoparticles;
depositing a gate insulator on the thin film;
depositing a gate material on the gate insulator;
etching the gate material and the gate insulator from a source location and from a drain location;
depositing a source material in the source location and a drain material in the drain location; and
depositing contacts for the source, gate, and drain.

19. The method of claim 18, wherein the n-type substrate comprises Si, Ge, SiGe, GaAs, InGaAs, ZnS, ZnSe, SiC, or GaN.

20. The method of claim 18, further comprising redistributing the p-type dopant species to modify the size and/or shape of the doped region on the surface of the n-type substrate.

21. The method of claim 18, wherein the gate of the p-channel field effect transistor is a sub-22 nanometer gate.

22. The method of claim 18, wherein the nanoparticles comprise silicon oxide-coated-silicon, silicon oxide, a silane, tetraethoxysilane, or a combination comprising at least one of the foregoing.

23. A p-channel field effect transistor made by the process of claim 18.

24. A method of forming an n-channel field effect transistor, comprising:
depositing a patterned mask layer on a surface of a p-type substrate;
introducing n-type dopant species to at least a portion of the unmasked surface of the p-type substrate to form n-type regions on the surface of the p-type substrate;
removing the patterned mask layer from the surface of the p-type substrate;
contacting a plurality of nanoparticles with the surface of the p-type substrate;
self-assembling a layer of the nanoparticles on the p-type regions of the surface of the p-type substrate;
depositing a layer of a dielectric material on the surface of the p-type substrate, wherein the nanoparticles serve as a mask for the deposition of the layer of the dielectric material;
removing the nanoparticle mask from the surface of the p-type substrate;
depositing a gate insulator on the surface of the p-type substrate;
depositing a gate material on the gate insulator;
etching the gate material and the gate insulator from a source location and from a drain location;
depositing a source material in the source location and a drain material in the drain location; and
depositing contacts for the source, gate, and drain.

25. The method of claim 24, wherein the p-type substrate comprises Si, Ge, SiGe, GaAs, InGaAs, ZnS, ZnSe, SiC, or GaN.

26. The method of claim 24, further comprising redistributing the n-type dopant species to modify the size and/or shape of the doped region on the surface of the p-type substrate.

27. The method of claim 24, wherein the gate of the n-channel field effect transistor is a sub-22 nanometer gate.

28. The method of claim 24, wherein the nanoparticles comprise silicon oxide-coated-silicon, silicon oxide, a silane, tetraethoxysilane, or a combination comprising at least one of the foregoing.

29. An n-channel field effect transistor made by the process of claim 24.

30. A complementary field effect transistor comprising the p-channel field effect transistor of claim 23 and the n-channel field effect transistor of claim 29.

* * * * *